(12) United States Patent
Lutter

(10) Patent No.: US 6,780,767 B2
(45) Date of Patent: Aug. 24, 2004

(54) SEMICONDUCTOR COMPONENT IN A WAFER ASSEMBLY

(75) Inventor: Stefan Lutter, Neuchatel (CH)

(73) Assignee: Nanoworld AG, Neuchatel (CH)

(*) Notice: Subject to any disclaimer, the term of this patent is extended or adjusted under 35 U.S.C. 154(b) by 0 days.

(21) Appl. No.: 10/178,636

(22) Filed: Jun. 21, 2002

(65) Prior Publication Data

US 2002/0197862 A1 Dec. 26, 2002

(30) Foreign Application Priority Data

Jun. 22, 2001 (EP) .............................. 01115136

(51) Int. Cl.$^7$ ............................................. H01L 21/00
(52) U.S. Cl. ...................... 438/678; 438/111; 438/110; 438/113; 438/106; 438/107; 438/114; 438/121; 438/52; 438/680; 438/681; 438/124; 438/123; 438/5; 438/50; 257/678; 257/684; 257/726; 257/725; 257/417; 257/415; 257/418; 29/829; 29/827
(58) Field of Search ................................. 438/110, 113, 438/106, 107, 114, 121, 52, 680, 681, 124, 123, 5, 50, 111; 257/726, 725, 417, 415, 418, 678, 666; 29/827, 829

(56) References Cited

U.S. PATENT DOCUMENTS 4,670,092 A   6/1987  Motamedi
5,998,234 A * 12/1999 Murata et al. ............... 438/53

FOREIGN PATENT DOCUMENTS

DE       197 34 530       2/1998

OTHER PUBLICATIONS

Patent Abstracts of Japan Publication No. 11186565, entitled Semiconductor Acceleration Sensor and Manufacture Thereof, By Funahashi, published Jul. 9, 1999.
Patent Abstracts of Japan Publication No. 04102066, entitled Acceleration Sensor and Its Manufacture, By Sato, published Apr. 3, 1992.
An article entitled "Silicon as a Mechanical Material", By Kurt E. Peterson, published by Proceedings of the IEEE, vol. 70, No. 5, May, 1982, pp. 420–457.

* cited by examiner

Primary Examiner—Eddie C. Lee
Assistant Examiner—Junghwa Im
(74) Attorney, Agent, or Firm—Bachman & LaPointe, P.C.

(57) ABSTRACT

Semiconductor components in a wafer assembly, in which the components are connected to a frame by means of in each case one holder and are formed from the same silicon wafer. The holder connects the respective component to the frame on one side and has a desired breaking point. The desired breaking point is designed as a V-shaped groove, the surfaces of which form crystal planes. According to the method, the patterning for production of the holder takes place on the wafer back surface, with subsequent wet chemical anisotropic etching of the V-groove. In this way, the holder is produced independently of the processing of the wafer front surface, and when the semiconductor component is removed a defined broken edge is formed without there being any risk of the semiconductor component being damaged.

7 Claims, 2 Drawing Sheets

SEMICONDUCTOR COMPONENT IN A WAFER ASSEMBLY

BACKGROUND OF THE INVENTION

Semiconductor components in a wafer assembly, in which the components are connected to a frame by means of in each case one holder and are formed from the same silicon wafer. The invention also relates to a method for fabricating semiconductor components in a wafer assembly of this type.

During fabrication of semiconductor components from a silicon wafer ((100) silicon wafer), the individual components, together with a frame and a holder which connects the component to the frame, are produced from a single silicon wafer. The holder comprises a bar which extends transversely across the component and is fixed to the frame on both sides. These bars, the only purpose of which is to fix the components to the frame, are fabricated by photolithographic patterning of the wafer front surface with subsequent dry or wet chemical etching processes for shaping. The opening up of the components and of the frame, i.e. the separation of the components from the frame, is effected by photolithographic patterning of the wafer front surface and/or the wafer back surface with subsequent dry or wet chemical etching processes for shaping. The component itself is then broken out of the frame by applying pressure to the component until the bar breaks. Alternatively, the bar may also be broken by the application of a torsional load by rotating the component out of the wafer plane.

In this method of fabricating the semiconductor component, the bars are fabricated from the wafer front surface, so that all the fabrication and machining processes carried out on the semiconductor component have to be adapted to the fabrication process used for the bars. Consequently, there is a considerable interdependency between fabrication of the bars and processing of the semiconductor component. There are generally no crystallographically preferred breaking edges, since these require additional process steps. Therefore, during the breaking-out operation, there are no reproducible broken edges formed on the bars, or the bars may splinter when the semiconductor component is broken out, and these splinters may cause damage to the semiconductor component. A further drawback is that the thickness of the bars usually has to be defined by time-controlled etching during the opening up of the semiconductor components.

The present invention is therefore based on the object of proposing a possible way of eliminating the above-mentioned drawbacks.

SUMMARY OF THE INVENTION

According to the invention, this object is achieved by the semiconductor components in a wafer assembly in which the components are connected to a frame by means of in each case one holder and are formed from the same silicon wafer, wherein the holder on one side connects the respective component to the frame and has a desired breaking point and by a method for fabricating semiconductor components having semiconductor components which are connected to a frame by holder means and are formed from the same silicon wafer, comprising the following steps: photolithographic patterning of the wafer back surface with a holder on one side, wherein the holder connects the semiconductor component to the frame; producing a desired breaking point on the holder by means of an etching operation between the frame and the semiconductor component; and opening up the semiconductor component and the frame by photolithographic patterning of the wafer front surface or back surface with subsequent chemical etching for shaping.

Accordingly, the semiconductor components in a wafer assembly have a holder which connects the respective component to the frame on one side and has a desired breaking point. In principle, this desired breaking point may be designed in various ways in the form of a thinning of the material in the region of the holder. The desired breaking point is advantageously formed by a groove between the frame and the component, which is preferably of V-shaped design. According to a preferred embodiment, the surfaces of the V-groove form (111) crystal planes. According to the method, a single-sided holder is produced, which holder in each case connects the component to the frame, by photolithographic patterning of the wafer back surface with subsequent etching of a groove in a region in which the frame has a thickened portion. The opening up of the component and of the frame is effected by photolithographic patterning of the wafer front surface and/or back surface with subsequent dry or wet chemical etching processes for shaping. If the process sequence is selected in a suitable way, the opening-up operation may take place at the same time as the fabrication of the holder.

The production of the desired breaking point may in principle be effected by means of a known etching operation, in which, according to a preferred configuration of the method, the V-groove is produced by wet chemical anisotropic etching.

The last of the three method steps mentioned above in connection with the opening up corresponds to the measures which are also employed in the prior art and is generally known. However, the lithographic patterning of the single-sided holder takes place on the wafer back surface. Therefore, the fabrication of the holder is completely independent of the processing of the wafer front surface. The cut edge of the converging crystallographic (111) planes of the V-groove according to a preferred configuration defines a desired breaking edge. The application of pressure to a component leads to the component tilting and therefore to the semiconductor component breaking out of the frame along the desired breaking edge. The result is the formation of a defined broken edge. Splintering of the silicon crystal is considerably reduced if not completely prevented. The risk of the component being damaged when it is being broken out is therefore likewise considerably reduced.

When the two surfaces of the V-groove converge, the depth etching stops on account of the crystallographic properties of the silicon. Consequently, very simple, time independent control of the thickness of the desired breaking point can be achieved during production.

In principle, it is also conceivable for the holder described above to be provided on a plurality of sides, for example on both sides of the semiconductor component in accordance with the prior art, but in this case the above-described advantages relating to the breaking out of the semiconductor component no longer apply in the manner which has been described above, and consequently the semiconductor component may once again be damaged.

The method provides an inexpensive way, which entails reduced scrap, of fabricating semiconductor components in a wafer assembly.

BRIEF DESCRIPTION OF THE DRAWINGS

The invention is explained in more detail below with reference to an exemplary embodiment and in conjunction with the accompanying drawings, in which.

DETAILED DESCRIPTION

Figure 1:
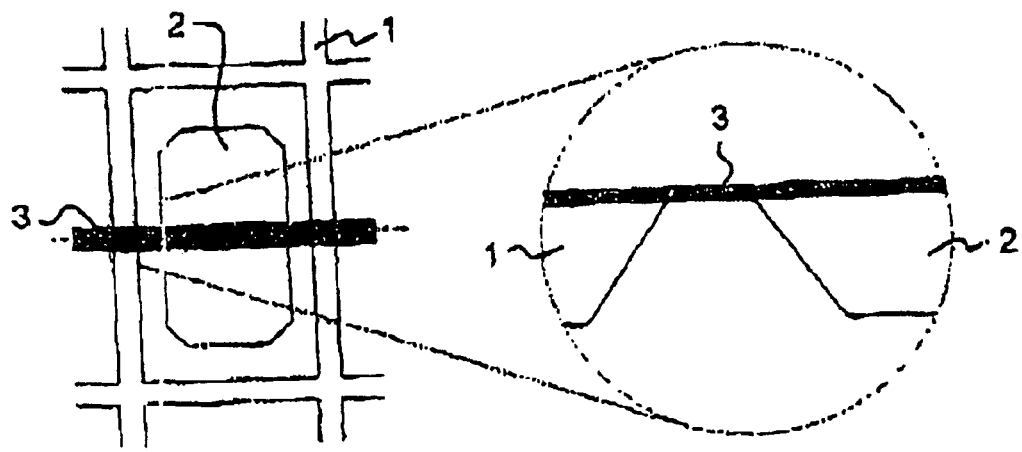
FIG. 1 shows a plan view of a semiconductor component in the wafer assembly in accordance with the prior art.

FIG. 1 shows part of a silicon wafer (not shown) having a frame 1, in which the semiconductor component 2 is secured. The semiconductor component 2 is connected to the frame by means of a bar 3. It can be seen from the enlarged view that the bar 3 connects the frame 1 and the semiconductor component 2 with a certain gap, i.e. semiconductor component 2 and frame 1 are spaced apart from one another.

Figure 2:
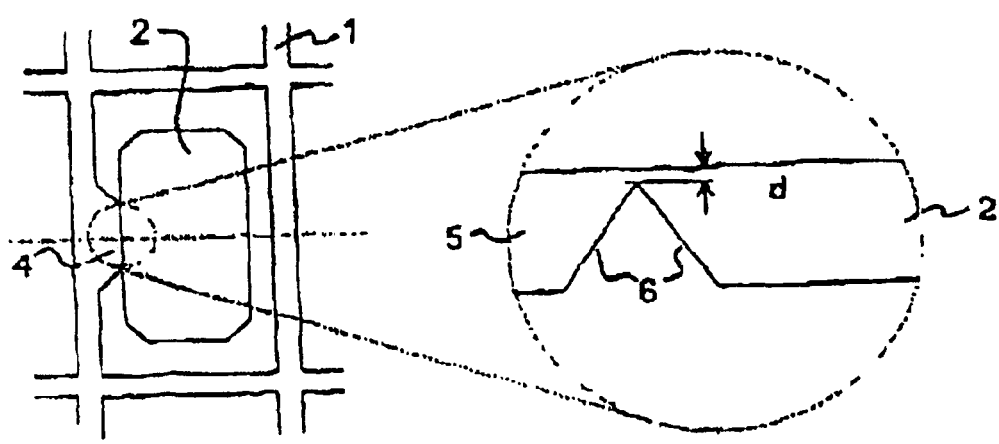
FIG. 2 shows a plan view of a semiconductor component in the wafer assembly in accordance with the invention.

FIG. 2 shows an arrangement corresponding to that shown in FIG. 1, but with the fabrication of the semiconductor component 2 in the frame 1 having taken place using the method according to the invention. The semiconductor component 2 is connected on one side by means of a holder 4. In this area, the holder 4 comprises a thickened portion 5 of the frame 1, so that the thickened portion 5 directly adjoins the semiconductor component 2. As can be seen from the enlarged illustration shown in FIG. 2, a V-groove 6, the surfaces of which converge in the silicon in such a way that a residual wall thickness d remains, is arranged between the thickened portion 5 of the holder 4 and the semiconductor component 2. As has already been mentioned above, the depth etching is stopped on account of the crystallographic properties of the silicon and the fact that the surfaces form (111) crystal planes. Consequently, the desired breaking point can be produced in a defined way.

FIGS. 3A to 3E explain the individual process steps involved in the fabrication of a holder for semiconductor components in the wafer assembly in accordance with the invention. In this specific exemplary embodiment, it is assumed that the processing of the component from the front surface has already been completed. In this case, the opening up of the component may take place together with the fabrication of the holding device. This means that there is no need for additional process steps in order to open up the component.

Figure 3A:
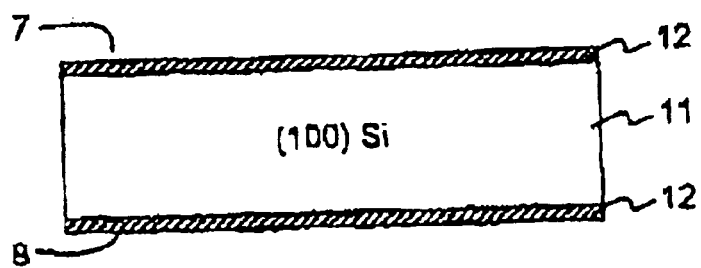
FIG. 3 shows an exemplary embodiment for fabrication of the holder of a semiconductor component in the wafer assembly in accordance with the invention, including the individual process steps required for this purpose.

FIG. 3A shows a (100) silicon wafer 11, on the front surface of which (corresponding to the top side in the illustration) the active surface of the component or sensor is to be located. This silicon wafer 11 is covered by a masking layer 12 on both sides. This masking layer may, for example, be a silicon oxide layer produced by oxidation or a silicon nitride layer produced by vapor deposition. In general, they must be layers which are suitable to act as an etching mask for anisotropic silicon etching.

Figure 3B:
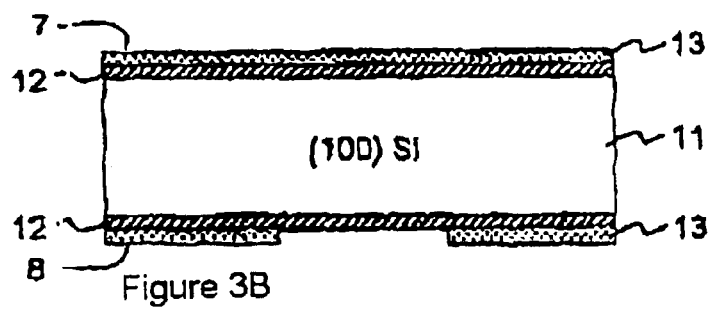

Then, as illustrated in FIG. 3B, a photosensitive resist 13 is applied to the back surface of the silicon wafer 11. The mask for fabrication of the holder 4 is transferred to this resist 13 by photolithographic patterning. Then, a resist 13 is also applied to the wafer front surface 7, in order to protect the latter, but this resist is not patterned. It is also possible to use a different resist from the resist which was applied to the wafer back surface 8.

Figure 3C:
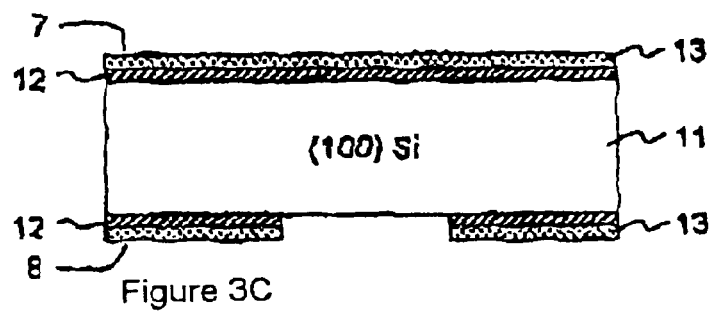

FIG. 3C shows the next step, in which the mask structure which has been transferred to the photoresist 13 is transferred to the masking layer 12 on the wafer back surface 8 by wet or dry chemical etching techniques. If the masking layer consists of silicon oxide or silicon nitride, this may be achieved by etching in dilute hydrofluoric acid.

Figure 3D:
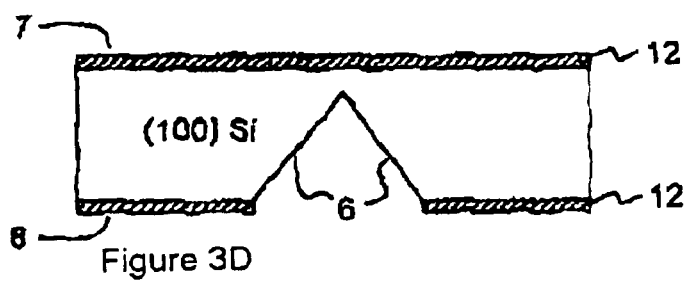

Then, the photoresist 13 is removed again from both sides of the silicon wafer 11. This may, for example, take place in a solvent, such as acetone. To completely remove residues of resist, it is then possible for cleaning to take place in a heated mixture of sulfuric acid and hydrogen peroxide. A subsequent anisotropic silicon etching step, which may, for example, take place in dilute, heated potassium hydroxide solution, causes a V-groove 6 to be etched into the silicon wafer 11. The boundary surfaces of this V-groove 6 form (111) crystal planes of the silicon. The depth etching stops automatically when the two (111) crystal planes meet. This is illustrated in FIG. 3D.

Figure 3E:
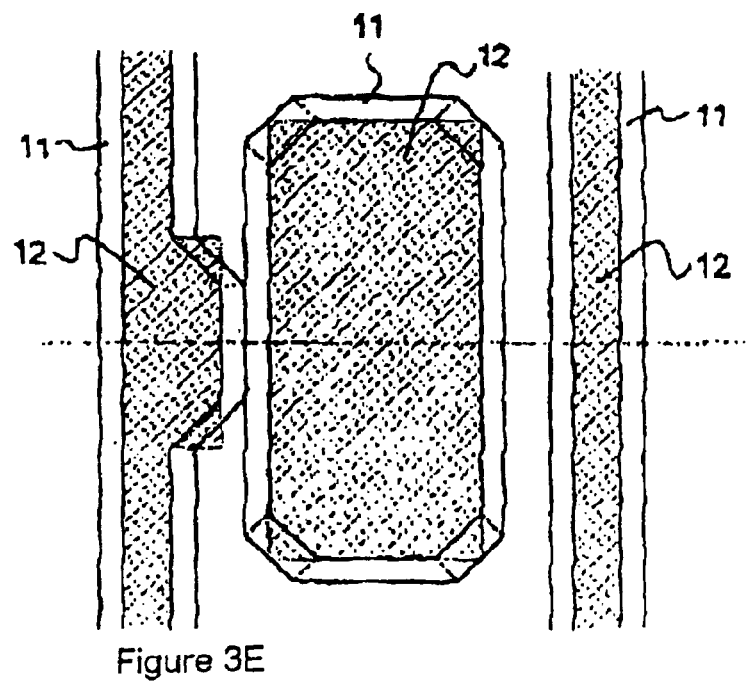

FIG. 3E shows a plan view of the back surface of the silicon wafer 11 after the anisotropic silicon etching has ended. The shape of the etching mask 12 which is required in order to fabricate a holder 4 in accordance with the invention can also be seen from this figure. The etch masking located on the wafer front surface 7 is not illustrated in this figure.

Finally, the etching masks 12 on the front and back surfaces of the silicon wafer 11 are removed again. If these masking layers consist of silicon oxide or silicon nitride, this can once again take place by etching in dilute hydrofluoric acid. If a silicon etching step of sufficient length is carried out, contact between component 2 and frame 1 remains only in the region of the thickened portion 5 of the frame 1 which has been produced. Otherwise, the component 2 is completely separate from the frame 1 (cf. FIG. 2).

It is to be understood that the invention is not limited to the illustrations described and shown herein, which are deemed to be merely illustrative of the best modes of carrying out the invention, and which are susceptible of modification of form, size, arrangement of parts and details of operation. The invention rather is intended to encompass all such modifications which are within its spirit and scope as defined by the claims.

What is claimed is:

1. A method for providing semiconductor components on a silicon wafer comprising the following steps:

providing a silicon wafer having a front and back surface;

photolithographic patterning of the back surface of the silicon wafer with semiconductor components, wherein each of the semiconductor components are connected to a frame by holder means provided at one side of said semiconductor components, wherein said semiconductor components and said holder means are formed of the same material and said frame forms a unit to which all semiconductor components are connected by said holder;

producing of a desired breaking point between the frame and each of said semiconductor components on said holder by an etching operation and stopping the etching operation before cutting through the silicon wafer to thereby define a breaking point; and thereafter, opening an area around said semiconductor components through said silicon wafer and the frame by photolithographic patterning of one of the silicon wafer front surface and back surface with subsequent chemical etching.

2. The method as claimed in claim 1, including producing a groove as the desired breaking point.

3. The method as claimed in claim 2, including producing a V-shaped groove.

4. The method as claimed in claim 3, wherein the V-shaped groove is produced by wet-chemical anisotropic etching.

5. The method as claimed in claim 4, including producing a V-shaped groove formed on crystal planes by etching.

6. The method as claimed in claim 1, wherein the etching comprises one of a wet chemical etching and dry etching.

7. The method as claimed in claim 1, further including separating the semiconductor components from the frame at the breaking point.

* * * * *